United States Patent
Mizusaki et al.

(10) Patent No.: US 10,293,973 B2
(45) Date of Patent: May 21, 2019

(54) WELDED SENSOR DEVICE FOR PREVENTING DEFORMATION FROM HEAT GENERATION DURING THE WELDING OF THE WELDED SENSOR DEVICE

(71) Applicant: OMRON CORPORATION, Kyoto-shi, Kyoto (JP)

(72) Inventors: Hiroyuki Mizusaki, Fukuchiyama (JP); Hirotaka Nakashima, Fukuchiyama (JP); Kazuyuki Ohashi, Kyoto (JP); Makoto Sugimoto, Ayabe (JP)

(73) Assignee: OMRON CORPORATION, Kyoto-shi, Kyoto (JP)

( * ) Notice: Subject to any disclaimer, the term of this patent is extended or adjusted under 35 U.S.C. 154(b) by 93 days.

(21) Appl. No.: 15/390,938

(22) Filed: Dec. 27, 2016

(65) Prior Publication Data
US 2017/0253369 A1 Sep. 7, 2017

(30) Foreign Application Priority Data
Mar. 3, 2016 (JP) .................. 2016-041600

(51) Int. Cl.
| | | |
|---|---|---|
| G01J 1/02 | (2006.01) | |
| B65D 6/32 | (2006.01) | |
| B65D 6/00 | (2006.01) | |
| B65D 85/38 | (2006.01) | |
| G01J 1/04 | (2006.01) | |
| H01L 31/0203 | (2014.01) | |
| G01D 11/26 | (2006.01) | |

(52) U.S. Cl.
CPC ................ B65D 7/38 (2013.01); B65D 7/42 (2013.01); B65D 85/38 (2013.01); G01D 11/26 (2013.01); G01J 1/0271 (2013.01); G01J 1/0407 (2013.01); H01L 31/0203 (2013.01)

(58) Field of Classification Search
CPC .............................. G01J 1/0271; G01S 7/4813
See application file for complete search history.

(56) References Cited

U.S. PATENT DOCUMENTS

| | | | | | |
|---|---|---|---|---|---|
| 5,949,062 | A | * | 9/1999 | Matsumoto | .......... H04N 1/0312 |
| | | | | | 250/208.1 |
| 2015/0258953 | A1 | | 9/2015 | Murray, Jr. et al. | |
| 2017/0059369 | A1 | | 3/2017 | Ootake et al. | |

FOREIGN PATENT DOCUMENTS

| | | |
|---|---|---|
| CN | 1211130 A | 3/1999 |
| CN | 203365699 U | 12/2013 |
| CN | 105180984 A | 12/2015 |
| CN | 106482763 A | 3/2017 |

(Continued)

OTHER PUBLICATIONS

Communication dated Aug. 2, 2017 from the European Patent Office in counterpart application No. 16206456.2.

(Continued)

*Primary Examiner* — Thanh Luu
(74) *Attorney, Agent, or Firm* — Sughrue Mion, PLLC

(57) ABSTRACT

A sensor device includes: a casing provided with an opening; a cover member covering the opening; a gasket interposed between the cover member and the casing; and a fixing cover which fixes both the gasket and the cover member to the casing. A plurality of welded portions bonding the casing and the fixing cover together are provided in a region outside the cover member such that the welded portions are distant from each other.

20 Claims, 11 Drawing Sheets

(56) References Cited

FOREIGN PATENT DOCUMENTS

| | | |
|---|---|---|
| JP | 10-74432 A | 3/1998 |
| JP | 2007-221007 A | 8/2007 |
| JP | 2013-211152 A | 10/2013 |
| JP | 2014-89805 A | 5/2014 |
| JP | 2015-158998 A | 9/2015 |

OTHER PUBLICATIONS

Communication dated Jul. 31, 2018 from the Japanese Patent Office in counterpart Application No. 2016-041600.
Communication dated Jan. 21, 2019, from State Intellectual Property Office of the P.R.C. in counterpart application No. 201611242215X.

* cited by examiner

WELDED SENSOR DEVICE FOR PREVENTING DEFORMATION FROM HEAT GENERATION DURING THE WELDING OF THE WELDED SENSOR DEVICE

BACKGROUND OF THE INVENTION

Field of the Invention

The present invention relates to a sensor device including a cover member which covers an opening provided to a casing and a fixing cover which fixes the cover member to the casing.

Description of the Background Art

A sensor device may need to have a casing with an external surface partially composed of a member different from the body of the casing, and in that case, the member is assembled to externally cover an opening provided to the body of the casing for example. In that case, in order to externally seal the casing's internal space to ensure resistance to the environment, an assembly structure is generally adopted in which a gasket is interposed between the above member and the casing's body and in that condition, a fixing cover is used to fix the above described member to the body.

For example, Japanese Patent Laying-Open No 2007-221007 discloses a case in which the above described assembly structure is adopted to assemble to a casing's body a transmissive plate which covers a light projecting and receiving opening of a photoelectric sensor serving as a sensor device. In the photoelectric sensor disclosed in the publication, an assembly structure is adopted which fixes a fixing cover to the casing's body by so-called snap fit composed of an engagement tab and an engagement hole.

However, the assembly structure as disclosed in the above publication has a configuration such that a tolerance of the engagement tab and hole per se, a tolerance of the casing's body and fixing cover provided with the engagement tab and hole, and furthermore, a tolerance of the gasket, etc., i.e., various parts' tolerances for implementing the assembly structure would be accumulated.

Accordingly, it would be significantly affected by variation in dimension of these parts and it is not easy to ensure high resistance to an environment, and in a relatively severe environment where a cutting oil or a similar oil, a significantly corrosive agent etc. are used in large amounts, stable sealing performance cannot be ensured over a long period of time.

Furthermore, when the above described tolerance accumulation is considered, then, in order to absorb various parts' dimensional variation, it would be necessary to increase the gasket in size to ensure a large deformation margin, which would obstruct miniaturization of the sensor device.

Furthermore, in order to firmly fix the fixing cover to the casing's body by using snap fit against the gasket's resilience, the fixing cover is required to have a sufficiently long distance from a portion which covers a member to be fixed to a portion provided with the engagement tab or hole, and the sensor device's external design may be impaired.

SUMMARY OF INVENTION

The present invention has been made to solve the above issues and contemplates a sensor device including a sealing structure which requires only a small volume for sealing and can obtain high sealing performance stably over a long period of time.

The sensor device based on the present invention includes a casing, a cover member, a gasket, and a fixing cover. The casing is provided with an opening and the cover member covers the opening. The gasket is interposed between the cover member and a portion of the casing located at a peripheral edge of the opening, to surround the opening. The fixing cover presses the cover member toward the casing and thus holds the cover member to bring the gasket into close contact with the casing and the cover member. In the sensor device based on the present invention, a plurality of welded portions bonding the casing and the fixing cover together are provided in a region outside the cover member such that the welded portions are distant from each other.

By this configuration, a problem in an assembly structure for a cover member, as conventional, i.e., various parts' tolerance accumulation, can be significantly resolved, and as a consequence, a sensor device can be obtained which allows a gasket to have resilience with a high degree of margin and can obtain high sealing performance stably over a long period of time.

In the sensor device based on the present invention, the casing may include a first external surface provided with the opening, a second external surface extending continuously from the first external surface to configure a first projected corner with the first external surface, and a third external surface located on a side opposite to that on which the second external surface is located as seen from the first external surface, and extending continuously from the first external surface to configure a second projected corner with the first external surface. In that case, it is preferable that the fixing cover include a first plate-like portion which covers at least a portion of the first external surface, a second plate-like portion which covers at least a portion of the second external surface, and a third plate-like portion which covers at least a portion of the third external surface such that the fixing cover straddles the first external surface, the second external surface, and the third external surface. Furthermore, in that case, it is preferable that at least one of the plurality of welded portions be provided to bond the second external surface and the second plate-like portion together, and at least another one of the plurality of welded portions be provided to bond the third external surface and the third plate-like portion together.

By this configuration, the cover member's rigidity can be enhanced, and warping which may be caused in the cover member can be suppressed and accordingly, a welded area by a welded portion can be significantly reduced.

In the sensor device based on the present invention, it is preferable that the first external surface and the first plate-like portion be not bonded together.

By this configuration, a welded portion is not located in a vicinity of a member which is easy affected by a thermal effect, such as the gasket and the cover member, and a problem such as a reduced yield can be avoided.

In the sensor device based on the present invention, it is preferable that the second plate-like portion and the third plate-like portion be pressed against the second external surface and the third external surface, respectively, by a resilient force which the fixing cover has.

This configuration can suppress a large error caused in a precision in assembling various parts in an assembling operation before bonding by welding, and a sensor device which has high sealing performance can be produced stably with a good yield.

In the sensor device based on the present invention, it is preferable that the first projected corner and the second projected corner be each provided with a chamfered portion.

This configuration can suppress a large error caused in a precision in assembling various parts in an assembling operation before bonding by welding, and a sensor device which has high sealing performance can be produced stably with a good yield.

In the sensor device based on the present invention, the first external surface may be provided with a loop groove in which the gasket is accommodated, and in that case, it is preferable that the plurality of welded portions be each provided at a position on a side of the casing inwardly of a bottom surface of the loop groove in a direction along a normal to an opening plane of the opening.

By this configuration, a welded portion is not located in a vicinity of a member which is easy affected by a thermal effect, such as the gasket and the cover member, and a problem such as a reduced yield can be avoided.

In the sensor device based on the present invention, it is preferable that one of the second external surface and the second plate-like portion be provided with a first engaging portion and the other of the second external surface and the second plate-like portion be provided with a first engaged portion, and that one of the third external surface and the third plate-like portion be provided with a second engaging portion and the other of the third external surface and the third plate-like portion be provided with a second engaged portion. In that case, it is preferable that the first engaging portion and the first engaged portion be engaged together and the second engaging portion and the second engaged portion be engaged together.

This configuration can suppress a large error caused in a precision in assembling various parts in an assembling operation before bonding by welding, and a sensor device which has high sealing performance can be produced stably with a good yield.

In the sensor device based on the present invention, it is preferable that a portion of the first plate-like portion immediately adjacent to the second plate-like portion and a portion of the first plate-like portion immediately adjacent to the third plate-like portion be both formed to be bent to be away from the first external surface.

This configuration can suppress a large error caused in a precision in assembling various parts in an assembling operation before bonding by welding, and a sensor device which has high sealing performance can be produced stably with a good yield.

In the sensor device based on the present invention, the opening may have a generally rectangular shape as seen in a direction along a normal to an opening plane of the opening, and furthermore, the gasket may have a generally rectangular shape having a corner in a form of a curve as seen in the direction along the normal to the opening plane of the opening. In that case, it is preferable that the plurality of welded portions be each provided at a position corresponding to the corner in the form of the curve.

By this configuration, a welded portion is not located in a vicinity of the gasket, which is easy affected by a thermal effect, and a problem such as a reduced yield can be avoided.

The present invention can thus provide a sensor device including a sealing structure which requires only a small volume for sealing and can obtain high sealing performance stably over a long period of time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will now be described hereinafter in detail with reference to drawings. An embodiment indicated hereinafter will be described by indicating as an example a case where the present invention is applied to a reflection type photoelectric sensor serving as a sensor device. In the following embodiment, identical or common components are identically denoted in the figures and will not be described repeatedly.

Figure 1:
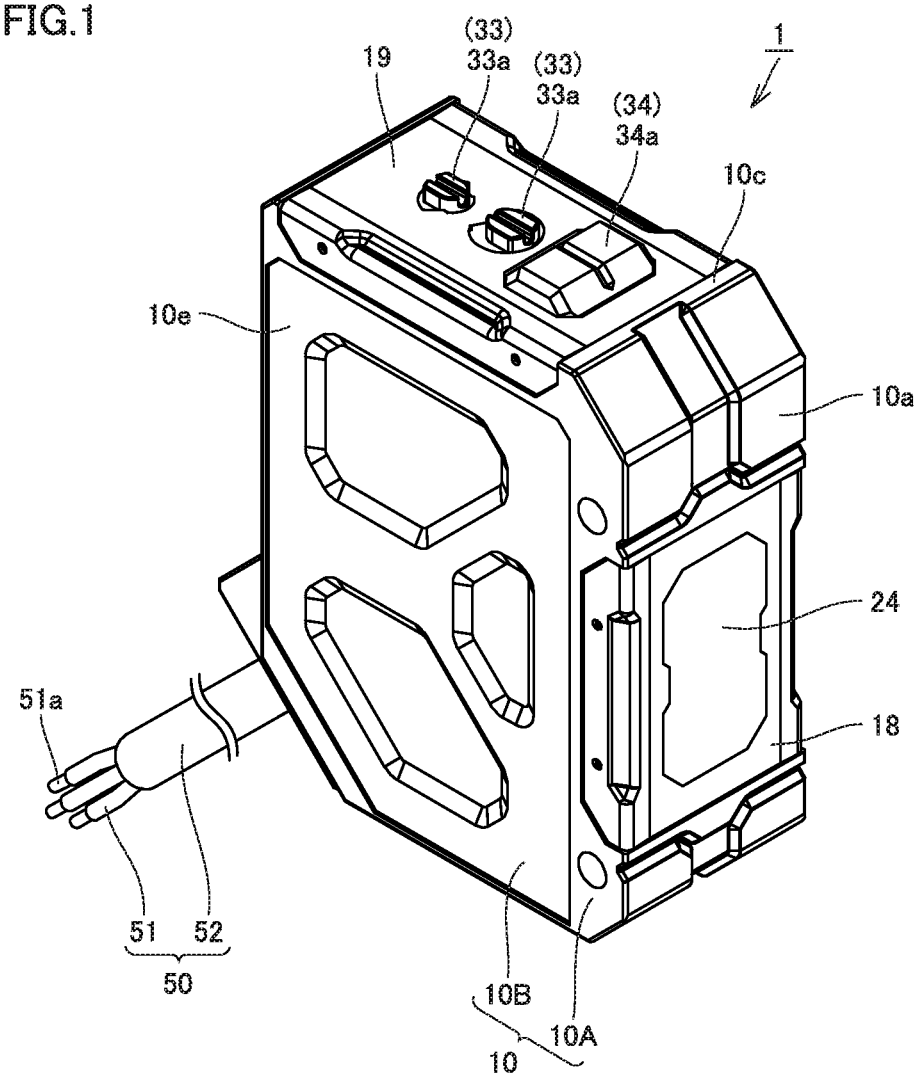
FIG. 1 is a perspective view of a photoelectric sensor in an embodiment of the present invention, as seen from a front side.
Figure 2:
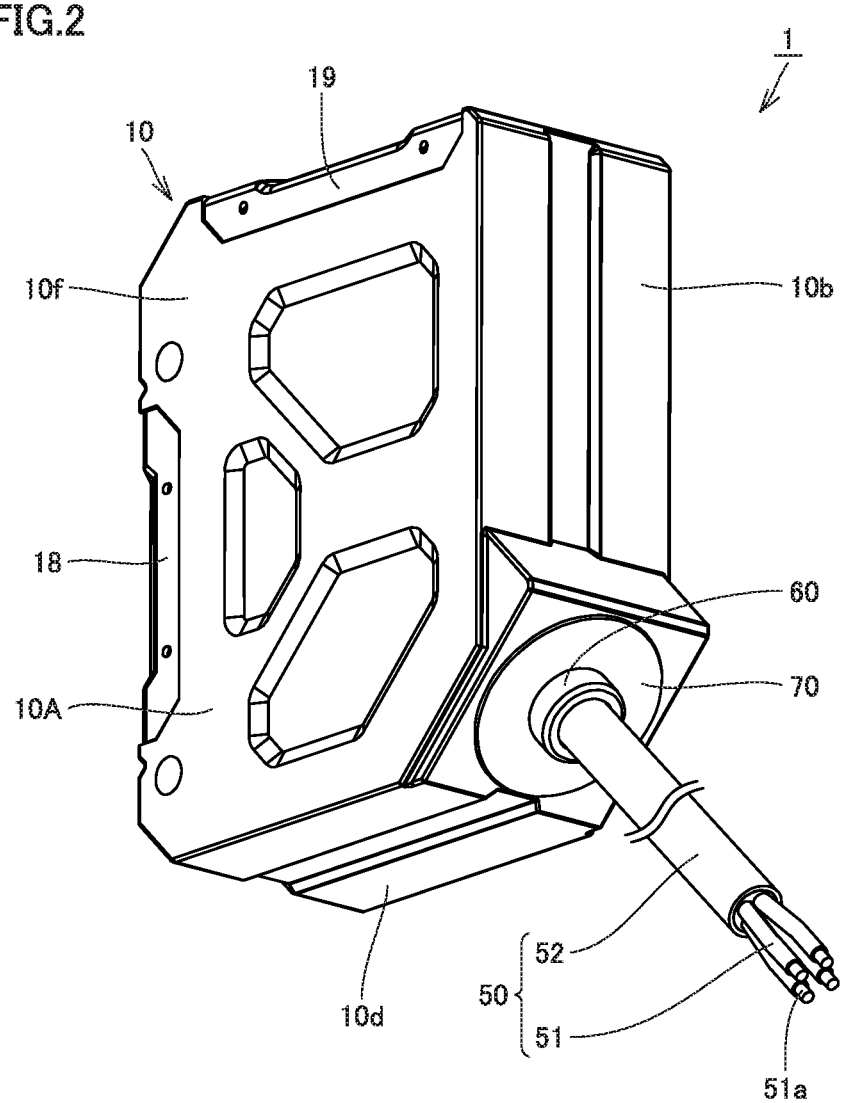
FIG. 2 is a perspective view of the photoelectric sensor shown in FIG. 1, as seen from a back side.
Figure 3:
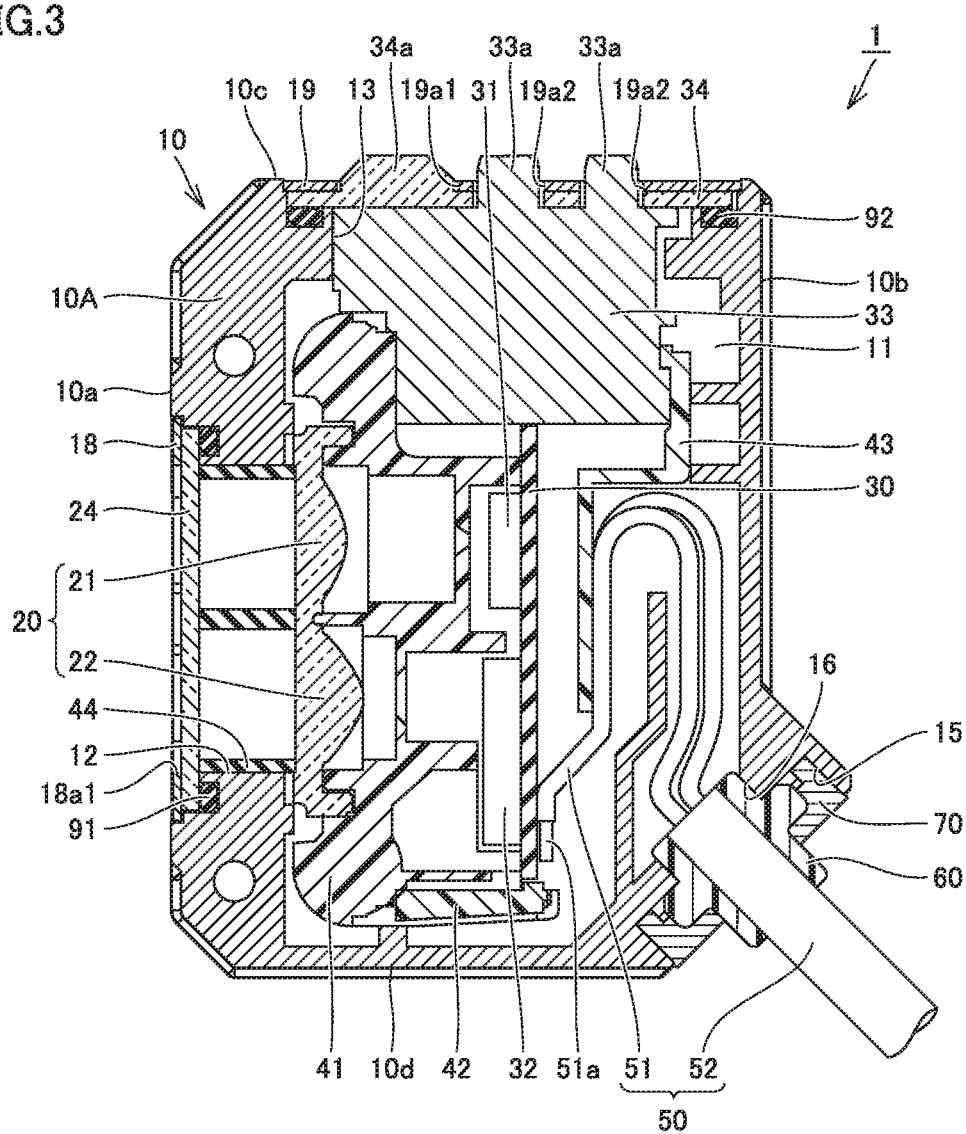
FIG. 3 is a schematic cross section of the photoelectric sensor shown in FIG. 1.
Figure 4:
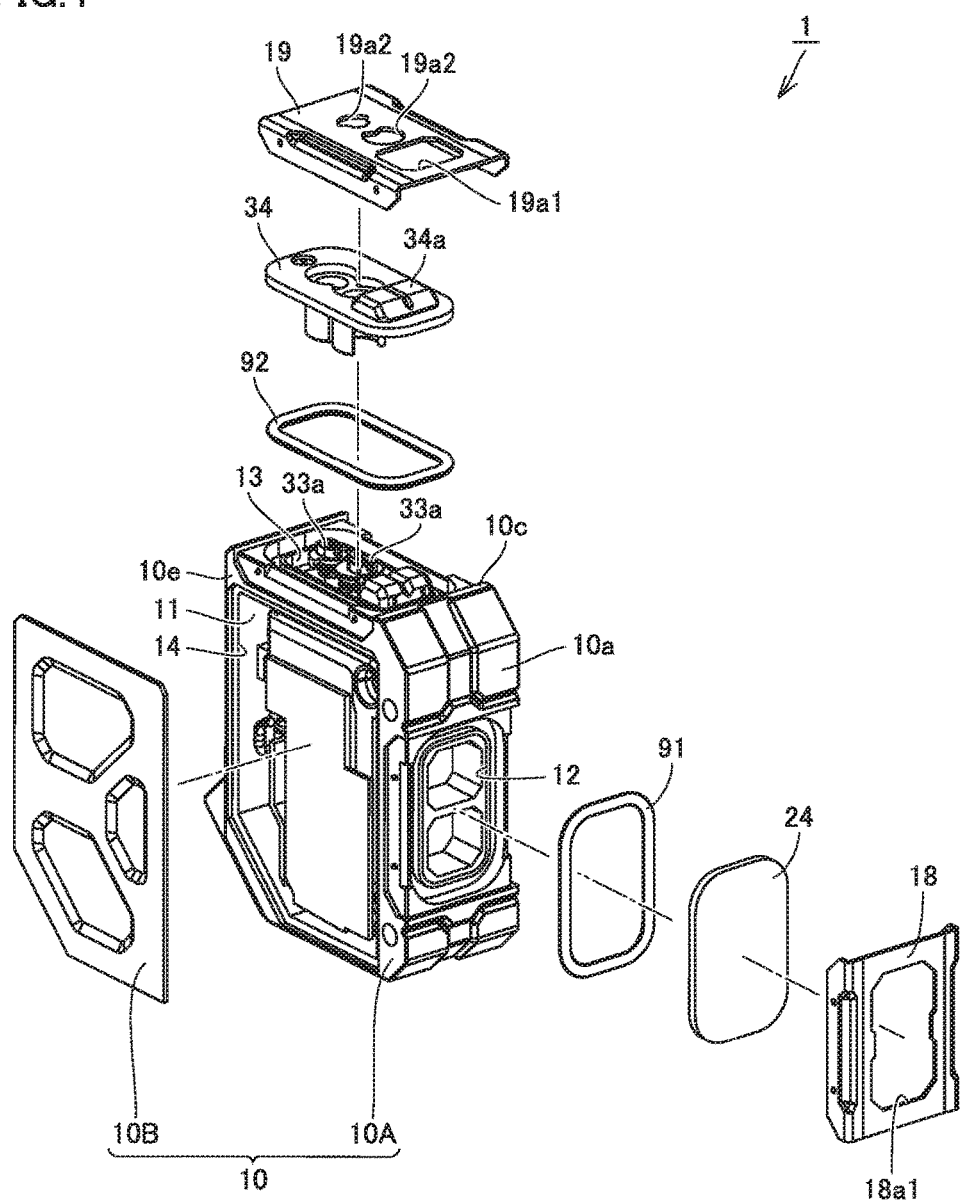
FIG. 4 is an exploded perspective view of a main portion of the photoelectric sensor shown in FIG. 1.

FIG. 1 is a perspective view of a photoelectric sensor in an embodiment of the present invention, as seen from a front side, and FIG. 2 is a perspective view of the photoelectric sensor shown in FIG. 1, as seen from a back side. Furthermore, FIG. 3 is a schematic cross section of the photoelectric sensor shown in FIG. 1, and FIG. 4 is an exploded perspective view of a main portion of the photoelectric sensor shown in FIG. 1. Initially, with reference to FIG. 1 to FIG. 4, a schematic configuration of a photoelectric sensor 1 in the present embodiment will be described.

As shown in FIG. 1 to FIG. 4, photoelectric sensor 1 is generally shaped substantially in the form of a rectangular parallelepiped, and mainly includes a casing 10, a lens member 20, a transmissive plate 24, a light projecting and receiving circuit board 30 on which a light projecting element 31 and a light receiving element 32 are mounted, a display and operation unit 33, a displaying transmissive member 34, various brackets 41-43, a cable 50, a bush 60, and a fixing member 70.

Casing 10 includes a body case 10A in the form of a box and a body cover 10B in the form of a flat plate. Body case 10A mainly configures a front surface 10a, a rear surface 10b, an upper surface 10c, a lower surface 10d, and a right side surface 10f of photoelectric sensor 1, and body cover 10B configures a portion of a left side surface 10e of photoelectric sensor 1. Note that front surface 10a is a surface where transmissive plate 24 is assembled, and rear surface 10b is a surface opposite to front surface 10a. Furthermore, upper surface 10c is a surface where display and operation unit 33 is assembled, and lower surface 10d is a surface opposite to upper surface 10c.

Body case 10A and body cover 10B are metallic members for example, and are suitably members made of stainless steel. Body case 10A is produced by metal injection molding (MIM) for example, and body cover 10B is produced by press-working a metal plate for example.

As shown in FIG. 4, a side surface opening 14 is provided at a portion corresponding to left side surface 10e of body case 10A, and body cover 10B is assembled to cover side surface opening 14. Body cover 10B for example has its peripheral edge entirely laser-welded and thus fixed to body case 10A.

Thus, an accommodation space 11 is formed inside casing 10 composed of body case 10A and body cover 10B, and various internal components such as lens member 20, light projecting and receiving circuit board 30, display and operation unit 33, brackets 41-43 etc are accommodated in accommodation space 11. Note that side surface opening 14 is an opening for assembling the above described various internal components to an interior of body case 10A. Note the photoelectric sensor can be established without display and operation unit 33.

As shown in FIG. 3 and FIG. 4, a front surface opening 12 is provided at a prescribed position through the front surface of body case 10A. As shown in FIGS. 1, 3 and 4, front surface opening 12 is covered with transmissive plate 24, and a cover 18 for the transmissive plate is assembled to body case 10A to further cover transmissive plate 24.

For example, cover 18 for the transmissive plate is a metallic member having a window 18a1 at that prescribed position and is suitably a member made of stainless steel. Cover 18 for the transmissive plate is produced by press-working a metal plate for example.

An O ring 91 which is a type of gasket is disposed between transmissive plate 24 and body case 10A, and in that condition when cover 18 for the transmissive plate is assembled to body case 10A a gap between transmissive plate 24 and body case 10A is filled with O ring 91. Thus, at a portion of body case 10A provided with front surface opening 12, accommodation space 11 located inside casing 10 is sealed from a space external to casing 10.

Note that front surface opening 12 is a portion required to be covered with a member (i.e., a cover member) other than the casing's body (body case 10A and body cover 10B that are metallic members), and transmissive plate 24 corresponds to this cover member. In contrast, cover 18 for the transmissive plate is a member for fixing transmissive plate 24 serving as the cover member to the casing's body, and corresponds to a fixing cover.

Note that photoelectric sensor 1 in the present embodiment has a feature in an assembly structure of assembling to body case 10A cover 18 for the transmissive plate, serving as the fixing cover, of these parts, which will be described in detail later.

As shown in FIG. 3 and FIG. 4, an upper surface opening 13 is provided at a prescribed position through the upper surface of body case 10A. As shown in FIGS. 1, 3 and 4, display and operation unit 33 is located in accommodation space 11 at a portion which faces upper surface opening 13, and display and operation unit 33 and upper surface opening 13 are covered with displaying transmissive member 34. Furthermore, a cover 19 for the display and operation unit is assembled to body case 10A to cover displaying transmissive member 34.

For example, cover 19 for the display and operation unit is a metallic member having a window 19a1 and a hole 19a2 at that prescribed position and is suitably a member made of stainless steel. Cover 19 for the display and operation unit is produced by press-working a metal plate for example.

An O ring 92 which is a type of gasket is disposed between displaying transmissive member 34 and body case 10A, and in that condition when cover 19 for the display and operation unit is assembled to body case 10A a gap between displaying transmissive member 34 and body case 10A is filled with O ring 92. Thus, at a portion of body case 10A provided with upper surface opening 13, accommodation space 11 located inside casing 10 is sealed from a space external to casing 10.

Note that upper surface opening 13 is also a portion required to be covered with a member (i.e., a cover member) other than the casing's body (body case 10A and body cover 10B that are metallic members), and displaying transmissive member 34 corresponds to this cover member. In contrast, cover 19 for the display and operation unit is a member for fixing displaying transmissive member 34 serving as the cover member to the casing body, and it corresponds to the fixing cover.

Note that photoelectric sensor 1 in the present embodiment also has a feature in an assembly structure of assembling to body case 10A cover 19 for the display and operation unit, serving as the fixing cover, of these parts, which will be described in detail later.

Display and operation unit 33 includes a display unit composed of a light emitting diode (LED) etc., an operation unit including a sensitivity adjusting volume and an operation selector switch, and a display and operation circuit board on which various electronic components configuring the display unit and the operation unit are mounted. The display and operation circuit board is electrically connected to light projecting and receiving circuit board 30 via a wiring etc. (not shown).

Note that, in FIG. 1, FIG. 3, and FIG. 4, of members which configure display and operation unit 33, a sensitivity adjusting volume control knob and an operation selector switch control knob are denoted by a reference numeral 33a, in particular. Furthermore, displaying transmissive member 34 includes a display lens portion 34a for diffusing light emitted from the display unit so that the light is externally, visually observable.

As shown in FIG. 3, in accommodation space 11 serving as a space in casing 10, at a position behind front surface opening 12, lens member 20 is disposed, and furthermore, at a position behind lens member 20, light projecting and receiving circuit board 30 is disposed. Furthermore, in front surface opening 12 at a portion located between lens member 20 and transmissive plate 24, a spacer 44 is disposed for maintaining a distance therebetween.

Light projecting and receiving circuit board 30 has a major surface facing lens member 20 and having an upper portion with light projecting element 31 which is for example a semiconductor light emitting diode, a semiconductor laser diode (LD), etc. mounted, and a lower portion with light receiving element 32 which is for example a semiconductor photodiode (PD) etc. mounted.

A portion of lens member 20 opposite to light projecting element 31 is provided with a light projecting lens 21, and a portion of lens member 20 opposite to light receiving element 32 is provided with a light receiving lens 22.

Thus, in photoelectric sensor 1, light emitted from light projecting element 31 is radiated to a space outside photoelectric sensor 1 via light projecting lens 21 and transmissive plate 24, and a reflection of the light is sensed by light receiving element 32 via transmissive plate 24 and light receiving lens 22.

Note that lens member 20, light projecting and receiving circuit board 30, and display and operation unit 33 are held in accommodation space 11 by various brackets 41-43 etc. assembled to an interior of casing 10.

Light projecting and receiving circuit board 30 has front and back surfaces with an electrically conductive pattern formed thereon, and has, in addition to light projecting element 31 and light receiving element 32, various electronic components mounted thereon. Thus, light projecting and receiving circuit board 30 is provided with various electrical circuits. The electrical circuits include a drive circuit for driving light projecting element 31, a signal processing circuit which photoelectrically converts the light that is sensed by light receiving element 32 into a prescribed output signal, a power supply circuit which receives externally supplied power, converts it to a prescribed power supply specification, and externally outputs it, etc. for example.

Light projecting and receiving circuit board 30 at a prescribed position closer to a lower end thereof is provided with a land to which an electrically conductive line 51a included in a core wire 51 of cable 50 described later is connected (not shown). The land and electrically conductive line 51a of cable 50 are connected together for example by soldering, and cable 50 is thus electrically connected to the above described various electrical circuits.

As shown in FIG. 1 to FIG. 3, cable 50 is composed of a composite cable composed of core wire 51 including electrically conductive line 51a and a sheath 52 which covers core wire 51. Note that cable 50 may further include a shielding material covering core wire 51 and also covered with sheath 52. Note that sheath 52 is made of resin for example, and more suitably, composed of any of polyvinyl chloride (PVC) resin, polyurethane (PUR) resin and fluororesin.

As shown in FIG. 3 and FIG. 4, a recess 15 is provided at an external surface of body case 10A configuring a position on the side of a rear and lower surface of casing 10. Recess 15 has a bottom surface provided with a cable inserting opening 16 in communication with accommodation space 11 provided inside casing 10 and a space external to casing 10.

Cable 50 is disposed through cable inserting opening 16 of body case 10A, and has one end drawn into casing 10 and electrically connected to light projecting and receiving circuit board 30 and the other end drawn out of casing 10.

At a prescribed position on cable 50, a cylindrical bush 60 is attached. Bush 60 is a rubber member, and is suitably composed of any of nitrile rubber (NBR), hydrogenated nitrile rubber (HNBR), and fluororubber.

Furthermore, in recess 15 of body case 10A, fixing member 70 in an annular form is fitted to thus fix cable 50 to casing 10. Fixing member 70 is a metallic member for example, and is suitably composed of brass.

Note that bush 60 is attached to cable 50, and in that condition, together with cable 50, press-fitted into cable inserting opening 16, and furthermore, fixing member 70 is press-fitted into recess 15 to compress bush 60. Thus, fixing member 70 cooperates with cable 50 to sandwich bush 60, and also cooperates with the bottom surface of recess 15 to sandwich bush 60.

Thus at these portions bush 60 closely contacts cable 50 and body case 10A and thus at those portions accommodation space 11 located inside casing 10 is sealed from a space external to casing 10.

Figure 5:
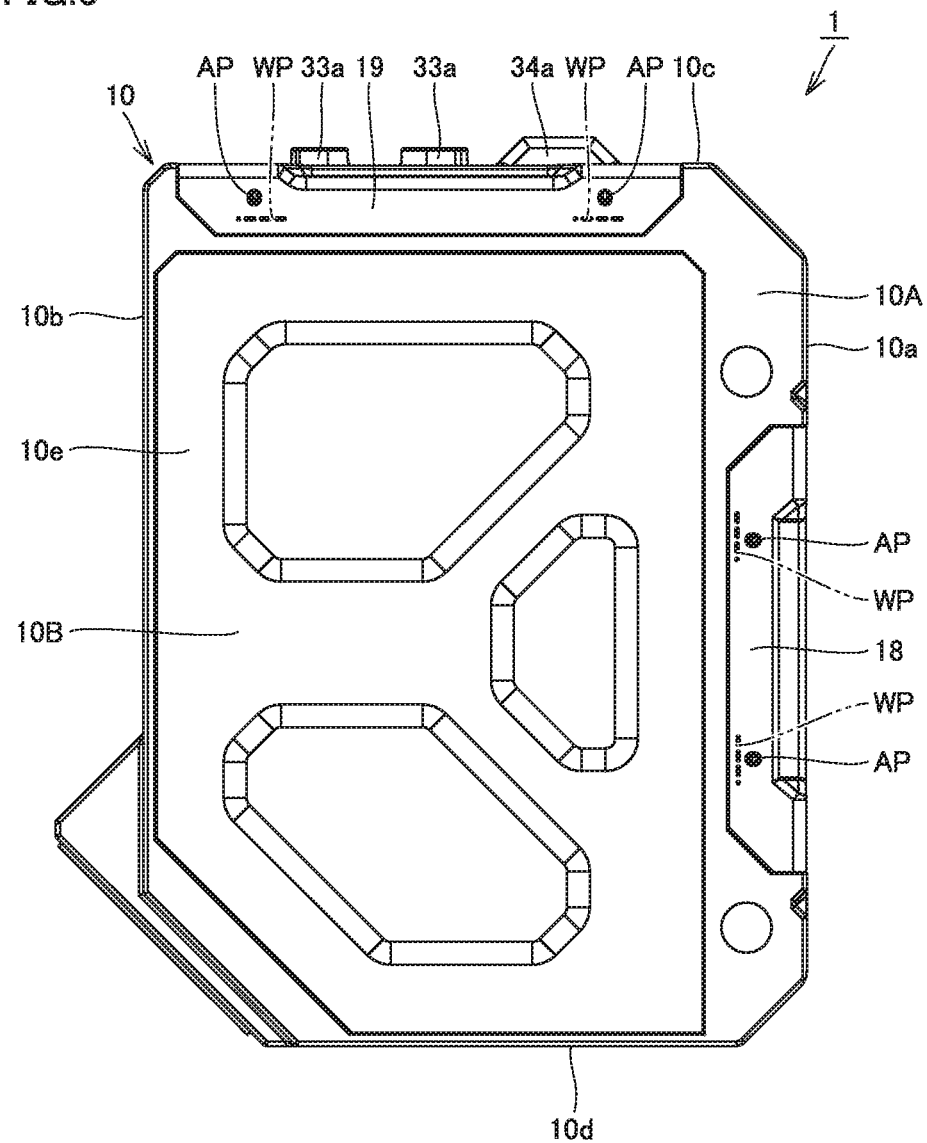
FIG. 5 is a right side view of the photoelectric sensor shown in FIG. 1, showing a welding location at which a cover for a transmissive plate and a cover for a display and operation unit are welded to a casing.
Figure 6:
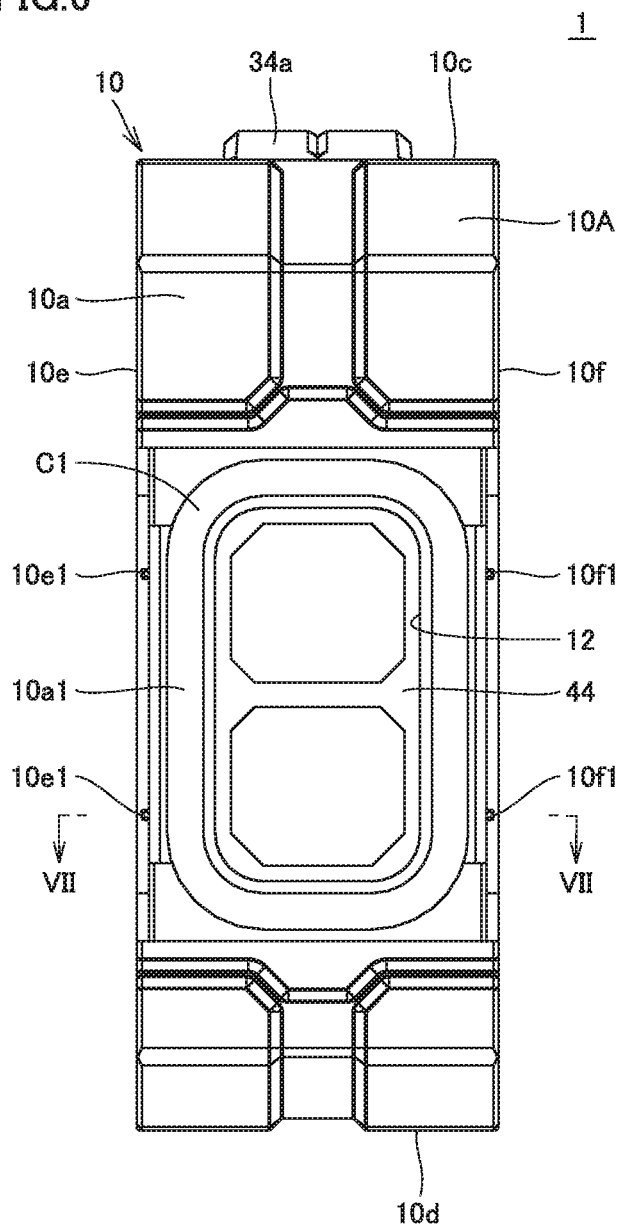
FIG. 6 is a front view of the photoelectric sensor shown in FIG. 1 with the cover for the transmissive plate and the transmissive plate removed therefrom.
Figure 7:
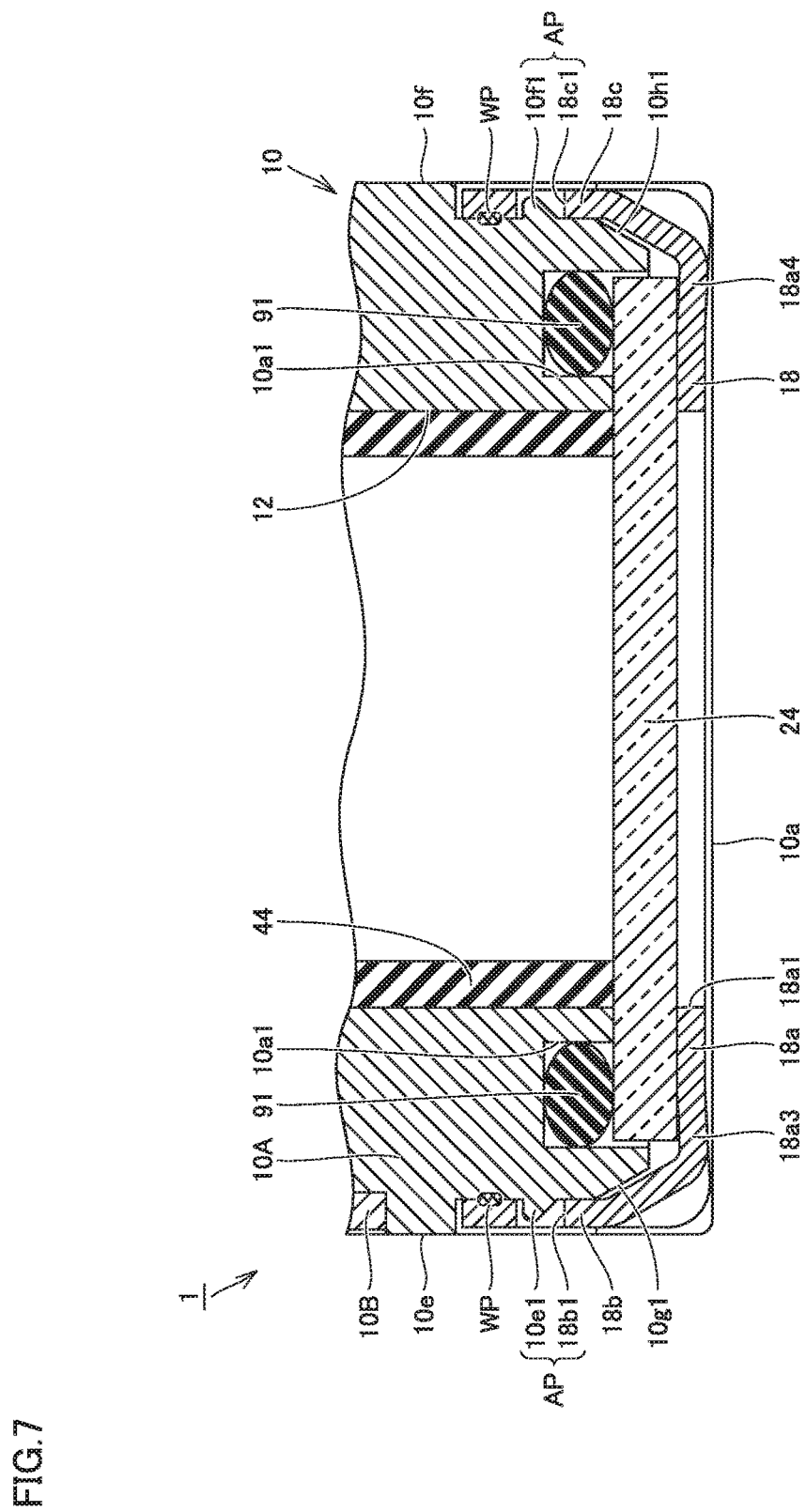
FIG. 7 is a schematic cross section of a main portion of the photoelectric sensor shown in FIG. 1, as taken along a line VII-VII shown in FIG. 6.
Figure 8:
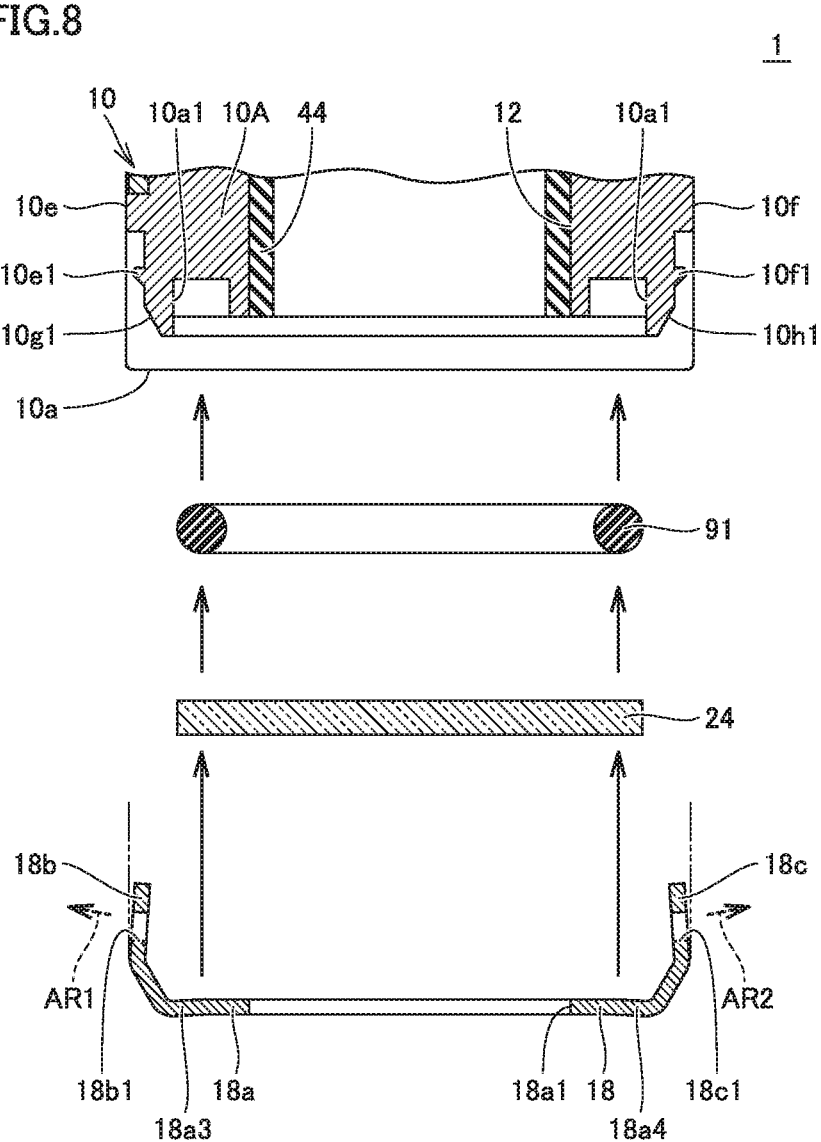
FIG. 8 is a schematic diagram of assembling to the casing the cover for the transmissive plate of the photoelectric sensor shown in FIG. 1.

FIG. 5 is a right side view of the photoelectric sensor shown in FIG. 1, showing a welding location at which the cover for the transmissive plate and the cover for the display and operation unit are welded to the casing, and FIG. 6 is a front view of the photoelectric sensor shown in FIG. 1 with the cover for the transmissive plate and the transmissive plate removed. Furthermore, FIG. 7 is a schematic cross section of a main portion of the photoelectric sensor shown in FIG. 1, as taken along a line VII-VII shown in FIG. 6, and FIG. 8 is a schematic diagram of assembling to the casing the cover for the transmissive plate of the photoelectric sensor shown in FIG. 1. Hereinafter, with reference to FIG. 5 to FIG. 8, an assembly structure for various parts in a vicinity of front surface opening 12 will be described.

With reference to FIG. 5, cover 18 for the transmissive plate, that assembles to front surface 10a of casing 10 transmissive plate 24 provided to cover front surface opening 12, is fixed to a position in a vicinity of front surface 10a of casing 10.

Herein, as shown in FIG. 7 and FIG. 8, cover 18 for the transmissive plate includes a first plate-like portion 18a which covers a portion of front surface 10a of casing 10, a second plate-like portion 18b which covers a portion of left side surface 10e of casing 10, and a third plate-like portion 18c which covers a portion of right side surface 10f of casing 10. Note that in the assembly structure portion for transmissive plate 24 assembled using cover 18 for the transmissive plate, front surface 10a of casing 10 corresponds to a first external surface, left side surface 10e of casing 10 corresponds to a second external surface, and right side surface 10f of casing 10 corresponds to a third external surface.

In the present embodiment, casing 10 is generally in the form of a rectangular parallelepiped, and accordingly, left side surface 10e, by extending continuously from front surface 10a, configures a projected corner 10g with front surface 10a, and right side surface 10f, by extending continuously from front surface 10a, configures a projected corner 10h1 with front surface 10a. Note that in the assembly structure portion for transmissive plate 24 assembled using cover 18 for the transmissive plate, projected corner 10g1 configured by front surface 10a and left side surface 10e corresponds to a first projected corner, and projected corner 10h1 configured by front surface 10a and right side surface 10f corresponds to a second projected corner.

First plate-like portion 18a of cover 18 for the transmissive plate is provided with window 18a1, as has been described above, for exposing transmissive plate 24. Note that transmissive plate 24 is disposed on front surface 10a of casing 10, and accordingly, a portion of cover 18 for the transmissive plate that faces transmissive plate 24 covers front surface 10a of casing 10 via transmissive plate 24.

Second plate-like portion 18b of cover 18 for the transmissive plate is provided with two positioning holes 18b1 at a prescribed position, and third plate-like portion 18c of cover 18 for the transmissive plate is provided with two positioning holes 18c1 at a prescribed position. These positioning holes 18b1 and 18c1 serve as a portion of a positioning portion AP for positioning cover 18 for the transmissive plate relative casing 10, as will be described later.

By the above described configuration, cover 18 for the transmissive plate is disposed at a position in a vicinity of front surface 10a of casing 10 and straddles front surface 10a, left side surface 10e, and right side surface 10f of casing 10.

Cover 18 for the transmissive plate is fixed to casing 10 by laser welding, and more specifically, second plate-like portion 18b and third plate-like portion 18c are welded to left side surface 10e and right side surface 10f, respectively, of casing 10 and thus assembled to casing 10.

Note that, as shown in FIG. 5, left side surface 10e of casing 10 and second plate-like portion 18b of cover 18 for the transmissive plate are bonded by welded portions WP, which are provided at two locations with a distance therebetween and are each provided at a position which is distant from front surface 10a of casing 10 as much as possible. More specifically, one of the two welded portions WP that bonds left side surface 10e of casing 10 and second plate-like portion 18b of cover 18 for the transmissive plate together is provided at a position which is on the side of an upper portion of second plate-like portion 18b of cover 18 for the transmissive plate and is also on the side of a rear portion of the second plate-like portion, and the other of the two welded portions WP is provided at a position which is on the side of a lower portion of second plate-like portion 18b of cover 18 for the transmissive plate and is also on the side of the rear portion of the second plate-like portion.

Thus providing welded portion WP distant from front surface 10a of casing 10 can prevent transmissive plate 24 and O ring 91 from being deformed and damaged as casing 10 generates heat in laser welding. Furthermore, the welding locations limited to a small area and also separated from each other allow laser welding to be done such that an amount of heat generated in casing 10 can be reduced, which can also suppress deformation and damage of transmissive plate 24 and O ring 91 etc.

Note that two welded portions WP may each be provided at a position on a side of casing 10 inwardly of a bottom surface of a loop groove 10a1 in a direction along a normal to an opening plane of front surface opening 12. This configuration allows welded portion WP to be disposed to be considerably distant from transmissive plate 24 and O ring 91 and can thus suppress deformation and damage of transmissive plate 24 and O ring 91. Furthermore, the configuration allows a laser beam to be radiated such that, in a direction in which the laser beam is radiated, O ring 91 is not located directly under a welding location, and inadvertently melting the O ring can also be avoided.

Preferably, individual welded portion WP has a shape in the form of a line or a spot etc. from a viewpoint of limiting a welded area to a small area. Note that, the radiated laser beam preferably has a spot diameter adjusted for example to several tens micrometers or more to 1.0 mm or less.

Note that, although not shown, welded portion WP that bonds right side surface 10f of casing 10 and third plate-like portion 18c of cover 18 for the transmissive plate is also provided at a left-right symmetrical position with respect to welded portion WP that bonds left side surface 10e of casing 10 and second plate-like portion 18b of cover 18 for the transmissive plate.

As shown in FIG. 6, a portion of casing 10 to which cover 18 for the transmissive plate is assembled has an external surface provided with a step such that a portion of front surface 10a recedes toward rear surface 10b and a portion of left side surface 10e and a portion of right side surface 10f recede toward right side surface 10f and left side surface 10e, respectively, and cover 18 for the transmissive plate is thus fitted in the step.

Front surface opening 12 is located at a prescribed position of front surface 10a of casing 10 defining a bottom surface of the step, and, furthermore, loop groove 10a1 is further provided at a position which surrounds front surface opening 12. Loop groove 10a1 defines a space in which O ring 91 is fitted.

Front surface opening 12 has a generally rectangular shape as seen in a direction along a normal to its opening plane, and loop groove 10a1 has a generally rectangular shape having a corner C1 in the form of a curve as seen in the direction along the normal to the opening plane of opening 12. Thus, O ring 91 fitted in loop groove 10a1, after being assembled, also follows the shape of loop groove 10a1, and accordingly has a generally rectangular shape having a corner in the form of a curve.

Note that providing welded portion WP at a position corresponding to the curved corner of O ring 91 (more specifically, a position which is equal in level to the corner and also located on left side surface 10e and right side surface 10f) ensures a larger distance from O ring 91 to welded portion WP and can further suppress deformation and damage of O ring 91.

Left side surface 10e of casing 10 defining the bottom surface of the step is provided with two positioning projections 10e1, and right side surface 10f of casing 10 defining the bottom surface of the step is provided with two positioning projections 10f1. Positioning projections 10e1 and 10f1 are provided to correspond to positioning holes 18b and 18c1 provided through second plate-like portion 18b and third plate-like portion 18c, respectively, of cover 18 for the transmissive plate.

Positioning projections 10e1, 10f1 are paired with the associated positioning holes 18b1, 18c to configure positioning portion AP, and positioning projections 10e1, 10f1 are fitted into positioning holes 18b1, 18c1 to position cover 18 for the transmissive plate relative to casing 10. By utilizing positioning portion AP, then, prior to laser welding, cover 18 for the transmissive plate can be positioned relative to casing 10 and thus provisionally fixed thereto, and laser welding's operability can be improved.

Assembling transmissive plate 24 to casing 10, as described above, is performed in the following procedure. Note that before the procedure is performed, various internal components such as lens member 20, light projecting and receiving circuit board 30, brackets 41-43, and spacer 44 are previously accommodated inside casing 10 (or body case 10A before body cover 10B is assembled thereto).

As shown in FIG. 8, O ring 91 is initially fitted into loop groove 10a1 provided in front surface 10a of casing 10. Thus, O ring 91, as seen in its axial direction (i.e., a direction in which a throughhole provided through O ring 91 extends, i.e., a vertical direction in FIG. 8), has one end side accommodated in loop groove 10a1 and the other end side bulging out of loop groove 10a1.

Subsequently, transmissive plate 24 is placed on O ring 91 partially bulging out of loop groove 10a1. In doing so, transmissive plate 24 is placed to be fitted into a portion of body case 10A that extends from an outer surface of an internal surface defining loop groove 10a1 continuously frontward, and thus positioned. Note that, for the sake of drawing, FIG. 8 shows top and bottom in a manner opposite to that in the actual operation.

Subsequently, cover 18 for the transmissive plate is put on front surface 10a of casing 10 to cover transmissive plate 24 placed on O ring 91. In doing so, cover 18 for the transmissive plate is attached to a front end of casing 10 such that second plate-like portion 18b of cover 18 for the transmissive plate is disposed outside left side surface 10e of casing 10 and third plate-like portion 18c of cover 18 for the transmissive plate is disposed outside right side surface 10f of casing 10, and in doing so, cover 18 for the transmissive plate is fitted into the above described step of casing 10.

Thus, on left side surface 10e of casing 10, positioning projection 10e fits into positioning hole 18b1, and on right side surface 10f of casing 10, positioning projection 10f1 fits into positioning hole 18c1. As a result, cover 18 for the transmissive plate is provisionally fixed to casing 10.

In the state where cover 18 for the transmissive plate is provisionally fixed to casing 10, transmissive plate 24 is held in a state where it is pressed toward casing 10 by cover 18 for the transmissive plate, and furthermore, O ring 91 is compressed in a forward and backward direction by transmissive plate 24 pressed toward casing 10 and is thus completely or substantially completely accommodated in loop groove 10a1.

Note that in the present embodiment, cover 18 for the transmissive plate that has the above described shape functions as a type of flat spring, and accordingly, as shown in FIG. 8, as second plate-like portion 18b and third plate-like portion 18c are previously formed to incline in a direction allowing their respective tips to approach each other, after cover 18 for the transmissive plate is attached to casing 10, second plate-like portion 18b and third plate-like portion 18c are pressed against left side surface 10e and right side surface 10f, respectively, of casing 10 by a resilient force which cover 18 for the transmissive plate has to ensure that the provisional fixed state is maintained.

Note that when this configuration is adopted, then, cover 18 for the transmissive plate is attached to casing 10 such that the cover is stretched in a direction to move second plate-like portion 18b and third plate-like portion 18c away from each other, as indicated in FIG. 8 by arrows AR1 and AR2.

Furthermore, in the present embodiment, a chamfered portion is previously formed at projected corners 10g1 and 10h1 of casing 10. By providing the chamfered portion, in attaching cover 18 for the transmissive plate, second plate-like portion 18b and third plate-like portion 18c of cover 18 for the transmissive plate can be prevented from being lifted off and the above described provisional fixed state is ensured.

Note that when this configuration is adopted, then in attaching cover 18 for the transmissive plate to casing 10, second plate-like portion 18b and third plate-like portion 18c are guided by the above described chamfered portion, and cover 18 for the transmissive plate can be easily attached to casing 10.

Furthermore, a portion 18a3 of first plate-like portion 18a of cover 18 for the transmissive plate immediately adjacent to second plate-like portion 18b (that is, an end of first plate-like portion 18a closer to second plate-like portion 18b), and a portion 18a4 of first plate-like portion 18a of cover 18 for the transmissive plate immediately adjacent to third plate-like portion 18c (that is, an end of first plate-like portion 18a closer to third plate-like portion 18c) may be formed to be bent so that they are away from front surface 10a of casing 10 after the cover is assembled (see FIG. 7). This also allows cover 18 for the transmissive plate to be attached such that second plate-like portion 18b and third plate-like portion 18c of cover 18 for the transmissive plate can be prevented from being lifted off, and thus ensures the above described provisional fixed state.

Subsequently, with the above described provisional fixed state maintained, a prescribed position on second plate-like portion 18b of cover 18 for the transmissive plate and a prescribed position on third plate-like portion 18c of cover 18 for the transmissive plate are irradiated with a laser beam to laser-weld cover 18 for the transmissive plate and casing 10 together. Thus, welded portion WP described above is formed and cover 18 for the transmissive plate is thus fixed to casing 10.

Note that preferably, the laser welding is performed such that, by externally applying a load, first plate-like portion 18a of cover 18 for the transmissive plate that is in the provisional fixed state is pressed toward front surface 10a of casing 10. Thus, in the provisional fixed state when O ring 91 is not completely accommodated in loop groove 10a1 it can be completely accommodated in loop groove 10a1 and the laser welding can be performed in that condition.

Figure 9:
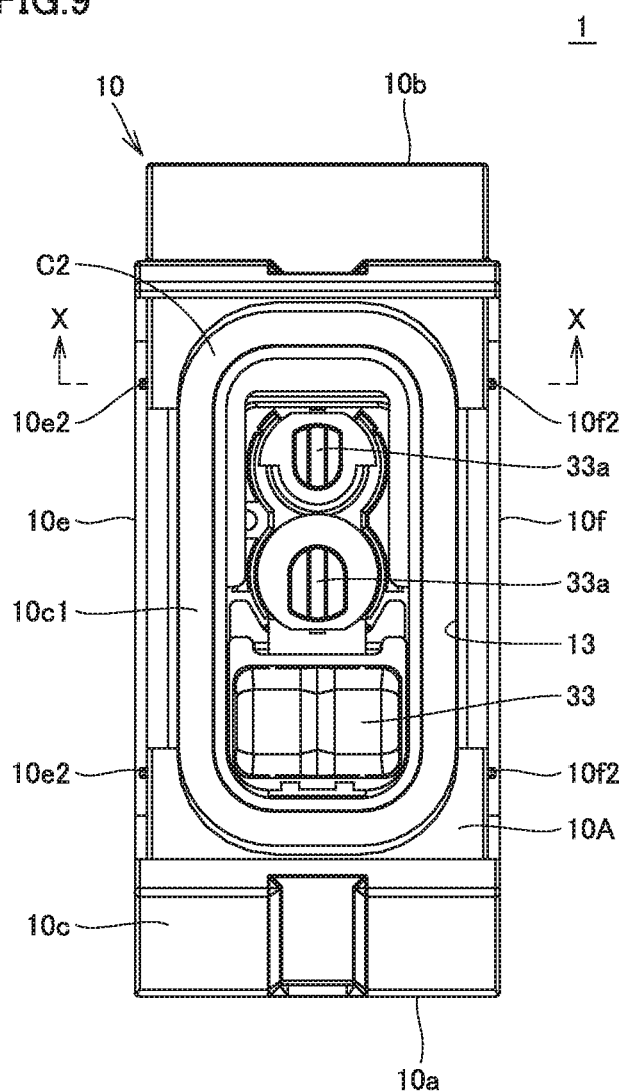
FIG. 9 is a top view of the photoelectric sensor shown in FIG. 1 with the cover for the display and operation unit and a displaying transmissive member removed therefrom.
Figure 10:
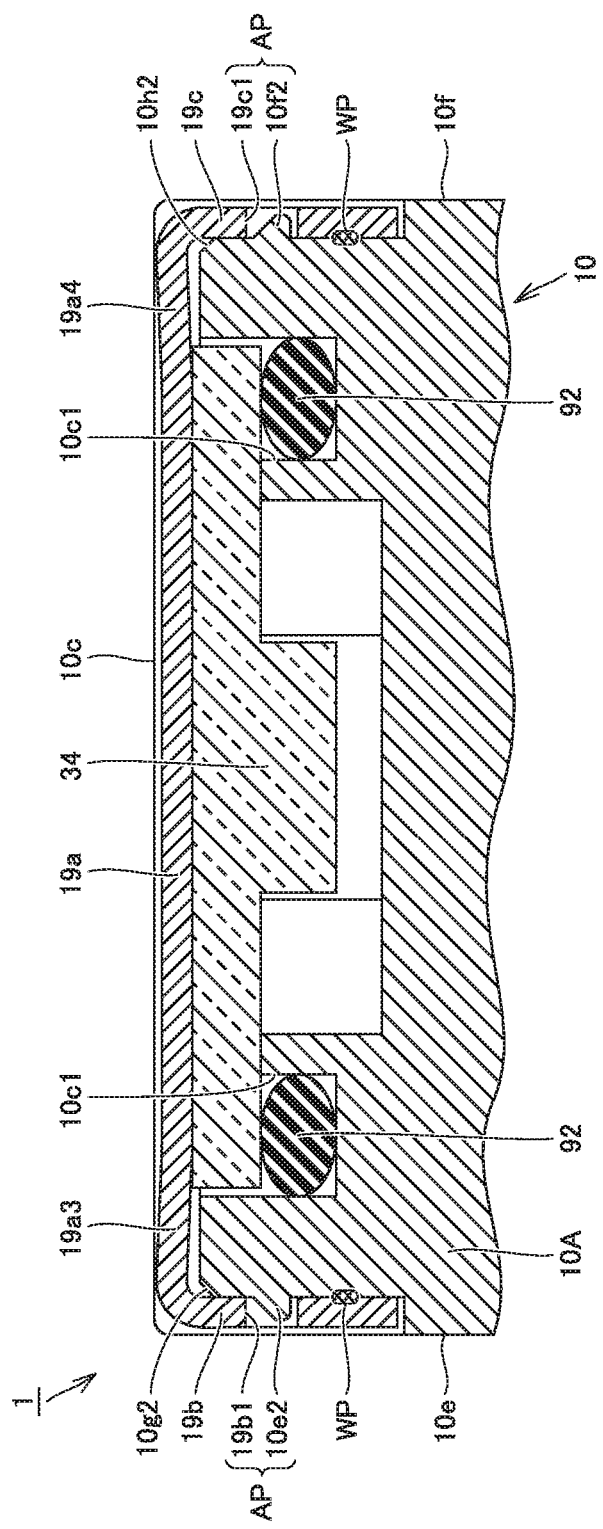
FIG. 10 is a schematic cross section of a main portion of the photoelectric sensor shown in FIG. 1, as taken along a line X-X shown in FIG. 9.
Figure 11:
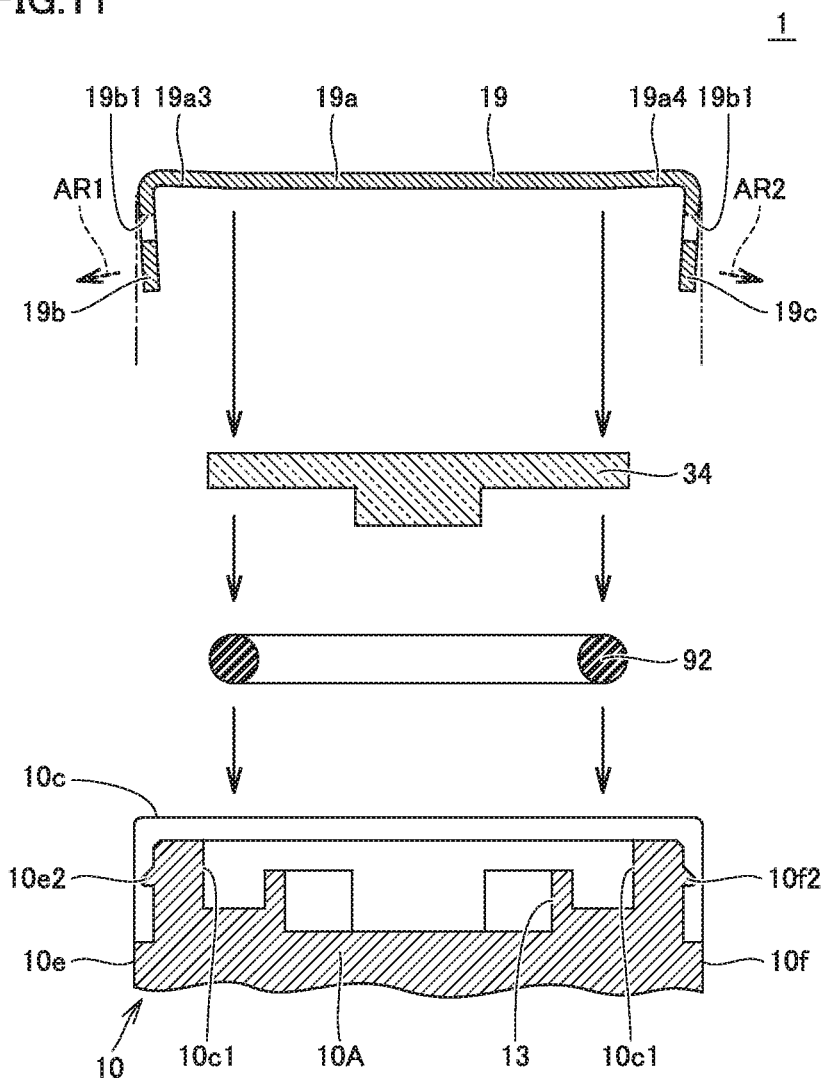
FIG. 11 is a schematic diagram of assembling to the casing the cover for the display and operation unit of the photoelectric sensor shown in FIG. 1.

FIG. 9 is a top view of the photoelectric sensor shown in FIG. 1 with the cover for the display and operation unit and the displaying transmissive member removed therefrom. Furthermore, FIG. 10 is a schematic cross section of a main portion of the photoelectric sensor shown in FIG. 1, as taken along a line X-X shown in FIG. 9, and FIG. 11 is a schematic diagram of assembling to the casing the cover for the display and operation unit of the photoelectric sensor shown in FIG. 1. Hereinafter, with reference to FIGS. 9-11 and 5, an assembly structure for various parts in a vicinity of upper surface opening 13, as has been described above, will be described. Note that the assembly structure for various parts in a vicinity of upper surface opening 13 is basically similar to the assembly structure for various parts in a vicinity of front surface opening 12, and accordingly, it will not be repeatedly described in detail.

With reference to FIG. 9, cover 19 for the display and operation unit, that assembles to upper surface 10c of casing 10 displaying transmissive member 34 provided to cover upper surface opening 13, is fixed to a position in a vicinity of upper surface 10c of casing 10.

Note that, as shown in FIG. 10 and FIG. 11, cover 19 for the display and operation unit includes a first plate-like portion 19a which covers a portion of upper surface 10c of casing 10, a second plate-like portion 19b which covers a portion of left side surface 10e of casing 10, and a third plate-like portion 19c which covers a portion of right side surface 10f of casing 10. Note that in the assembly structure portion for displaying transmissive member 34 assembled using cover 19 for the display and operation unit, upper surface 10c of casing 10 corresponds to a first external surface, left side surface 10e of casing 10 corresponds to a second external surface, and right side surface 10f of casing 10 corresponds to a third external surface.

In the present embodiment, casing 10 is generally in the form of a rectangular parallelepiped, and accordingly, left side surface 10e, by extending continuously from upper surface 10c, configures a projected corner 10g2 with upper surface 10c, and right side surface 10f, by extending continuously from upper surface 10c, configures a projected corner 10h2 with upper surface 10c. Note that in the assembly structure portion for displaying transmissive member 34 assembled using cover 19 for the display and operation unit, projected corner 10g2 configured by upper surface 10c and left side surface 10e corresponds to a first projected corner, and projected corner 10h2 configured by upper surface 10c and right side surface 10f corresponds to a second projected corner.

First plate-like portion 19a of cover 19 for the display and operation unit is provided with window 19a1, as described above, for exposing display lens portion 34a of displaying transmissive member 34, and hole 19a2, as described above, for exposing control knob 33a of display and operation unit 33 (see FIG. 4). Note that displaying transmissive member 34 is disposed on upper surface 10c of casing 10, and a portion of cover 19 for the display and operation unit that faces displaying transmissive member 34 thus covers upper surface 10c of casing 10 via displaying transmissive member 34.

Second plate-like portion 19b of cover 19 for the display and operation unit is provided with two positioning holes 19b1 at a prescribed position, and third plate-like portion 19c of cover 19 for the display and operation unit is provided with two positioning holes 19c1 at a prescribed position.

By the above described configuration, cover 19 for the display and operation unit is disposed at a position in a vicinity of upper surface 10c of casing 10 and straddles upper surface 10c, left side surface 10e, and right side surface 10f of casing 10.

Cover 19 for the display and operation unit is fixed to casing 10 by laser welding, and more specifically, second plate-like portion 19b and third plate-like portion 19c are welded to left side surface 10e and right side surface 10f, respectively, of casing 10 and thus assembled to casing 10.

Thus, as shown in FIG. 7, welded portion WP is formed at an abutment portion of left side surface 10e of casing 10 and second plate-like portion 19b of cover 19 for the display and operation unit, and welded portion WP is also formed at an abutment portion of right side surface 10f of casing 10 and third plate-like portion 19c of cover 19 for the display and operation unit. Note that, as shown in FIG. 5, these welded portions WP are formed at a position pursuant to that at which welded portion WP for fixing cover 18 for the transmissive plate to casing 10 is formed.

Furthermore, although not shown, welded portion WP that bonds right side surface 10f of casing 10 and third plate-like portion 19c of cover 19 for the display and operation unit together is also provided at a left-right symmetrical position with respect to welded portion WP that bonds left side surface 10e of casing 10 and second plate-like portion 19b of cover 19 for the display and operation unit together.

As shown in FIG. 9, a portion of casing 10 to which cover 19 for the display and operation unit is assembled has an external surface provided with a step such that a portion of upper surface 10c recedes toward lower surface 10d and a portion of left side surface 10e and a portion of right side surface 10f recede toward right side surface 10f and left side surface 10e, respectively, and cover 19 for the display and operation unit is thus fitted in the step.

Upper surface opening 13 is located at a prescribed position of upper surface 10c of casing 10 defining a bottom surface of the step, and, furthermore, a loop groove 10c1 is further provided at a position which surrounds upper surface opening 13. Loop groove 10c1 defines a space in which O ring 92 is fitted.

Upper surface opening 13 when seen in a direction along a normal to its opening plane has a generally rectangular shape, and loop groove 10c1 has a generally rectangular shape having a corner C2 in the form of a curve. Thus, O ring 92 fitted in loop groove 10c1, after being assembled, also follows the shape of loop groove 10a1, and accordingly has a generally rectangular shape having a corner in the form of a curve.

Left side surface 10e of casing 10 defining the bottom surface of the step is provided with two positioning projections 10e2, and right side surface 10f of casing 10 defining the bottom surface of the step is provided with two positioning projections 10f2. Positioning projections 10e2 and 10f2 are provided to correspond to positioning holes 19b1, 19c1 provided in second plate-like portion 19b and third plate-like portion 19c, respectively, of cover 19 for the display and operation unit.

Furthermore, as shown in FIG. 11, cover 19 for the display and operation unit has second plate-like portion 19b and third plate-like portion 19c formed to incline in a direction allowing their respective tips to approach each other.

Furthermore, as shown in FIG. 10, projected corners 10g2, 10h2 of casing 10 are each provided with a chamfered portion.

In addition, as shown in FIG. 10, a portion 19a3 of first plate-like portion 19a of cover 19 for the display and operation unit immediately adjacent to second plate-like portion 19b (that is, an end of first plate-like portion 19a closer to second plate-like portion 19b), and a portion 19a4 of first plate-like portion 19a of cover 19 for the display and operation unit immediately adjacent to third plate-like portion 19c (that is, an end of first plate-like portion 19a closer to third plate-like portion 19c) are both formed to be bent so that they are away from upper surface 10c of casing 10 after the cover is assembled.

Such an assembly structure portion for displaying transmissive member 34 has an effect similar to that obtained by the assembly structure portion for transmissive plate 24.

Thus, in photoelectric sensor 1 in the present embodiment, in a region outside transmissive plate 24 and displaying transmissive member 34 serving as a cover member, cover 18 for the transmissive plate and cover 19 for the display and operation unit serving as a fixing cover are laser-welded and thus bonded to casing 10 by a welded portion of a plurality of mutually distant locations.

Thus laser-welding and thus bonding cover 18 for the transmissive plate and cover 19 for the display and operation unit to thus fix them can significantly resolve the tolerance accumulation that has been a problem in fixing by snap fit as conventional. In other words, by fixing by laser-welding, in the laser-welding when cover 18 for the transmissive plate and cover 19 for the display and operation unit are correctly, provisionally fixed to casing 10, a tolerance which affects sealing performance is only a tolerance of transmissive plate 24 and displaying transmissive member 34 and a tolerance of O rings 91 and 92.

Of these, the tolerance of O rings 91 and 92, which are elastically deformable members, has a significantly small effect, and as the result only the tolerance of transmissive plate 24 and displaying transmissive member 34 poses a problem in reality.

However, tolerance accumulation as conventional does not arise, and even when transmissive plate 24 and displaying transmissive member 34 are managed with a normal tolerance, a reduction in sealing performance by the tolerance is significantly small. Accordingly, by adopting the above configuration, it is possible to allow the gasket to have resilience with a high degree of margin, and obtain high sealing performance stably over a long period of time. Thus, for example even in a relatively severe environment where a cutting oil or a similar oil, a significantly corrosive agent etc. are used in large amounts, high reliability can be ensured.

Furthermore, in the case of photoelectric sensor 1 in the present embodiment, cover 18 for the transmissive plate and cover 19 for the display and operation unit can have a considerably small distance from a portion covering transmissive plate 24 and displaying transmissive member 34 to a portion provided with a bonded portion provided by laser-welding, and the photoelectric sensor can be miniaturized and furthermore, have an external appearance less damaged in design.

Thus, photoelectric sensor 1 in the present embodiment can be a photoelectric sensor including a sealing structure which requires only a small volume for sealing and can obtain high sealing performance stably over a long period of time.

Note that, in the case of photoelectric sensor 1 of the above configuration, cover 18 for the transmissive plate and cover 19 for the display and operation unit are fixed to casing 10 by laser welding, and an effect can also be obtained which significantly reduces a possibility of cover 18 for the transmissive plate and cover 19 for the display and operation unit coming off casing 10, as compared with fixing using conventional snap fit.

Furthermore, in the case of photoelectric sensor 1 of the above configuration, cover 18 for the transmissive plate and cover 19 for the display and operation unit can be smaller than conventional and are hence also enhanced in rigidity, which can suppress warping which can be caused in cover 18 for the transmissive plate and cover 19 for the display and operation unit. This allows laser welding to be done at a minimized location, and can not only significantly eliminate the laser-welding's thermal effect but can also increase productivity. Note that in photoelectric sensor 1 of the above configuration, cover 18 for the transmissive plate and cover 19 for the display and operation unit that are shaped to straddle three external surfaces of casing 10 are utilized, and in that sense, cover 18 for the transmissive plate and cover 19 for the display and operation unit are enhanced in rigidity.

Furthermore, in photoelectric sensor 1 of the above configuration, cover 18 for the transmissive plate and cover 19 for the display and operation unit that are shaped to straddle three external surfaces of casing 10 are utilized, and accordingly, a direction in which bonding is done by welding can be different from a direction in which the gasket is compressed, so that an assembly structure which also has large endurance against thermal distortion etc. can be obtained and cover 18 for the transmissive plate and cover 19 for the display and operation unit can also be more firmly fixed to casing 10, and as a result a possibility of these coming off casing 10 can be significantly reduced.

Furthermore, in photoelectric sensor 1 of the above configuration, while cover 18 for the transmissive plate and cover 19 for the display and operation unit have a considerably small distance from a portion covering transmissive plate 24 and displaying transmissive member 34 to a portion provided with a bonded portion provided by laser-welding, their distance to a member which is of a material relatively weak against heat, such as O rings 91 and 92, transmissive plate 24 and displaying transmissive member 34, is ensured to be considerably large, and a thermal effect by adopting laser welding can be sufficiently eliminated. Thus, photoelectric sensor 1 of the configuration also does not have a problem such as a reduced yield and can also contribute to a reduced production cost.

Furthermore, while in the embodiment of the present invention described above a case has been described by way of example in which cover 18 for the transmissive plate and cover 19 for the display and operation unit serving as a fixing cover are assembled to straddle three external surfaces of casing 10, this is not a requirement and cover 18 for the transmissive plate and cover 19 for the display and operation unit can also be configured as a member in the form of a flat plate. In that case also, in a region outside transmissive plate 24 and displaying transmissive member 34 serving as a cover member, cover 18 for the transmissive plate and cover 19 for the display and operation unit are laser-welded and thus bonded to casing 10 by a welded portion of a plurality of mutually distant locations, and a photoelectric sensor can be obtained which includes a sealing structure which requires only a small volume for sealing and can obtain high sealing performance stably over a long period of time.

Furthermore, while in the embodiment of the present invention described above a photoelectric sensor has been described by way of example in which the present invention is applied to both the assembly structure portion for transmissive plate 24 and the assembly structure portion for displaying transmissive member 34, the present invention may be applied to one of them. Furthermore, the present invention is of course applicable to an assembly structure portion for a different cover member other than the assembly structure portion for transmissive plate 24 and the assembly structure portion for displaying transmissive member 34.

Furthermore, while in the embodiment of the present invention described above a case has been described by way of example in which the present invention is applied to a reflection type photoelectric sensor, the present invention is not limited thereto in to what it is applied, and the present invention is of course also applicable to a photoelectric sensor in a different form, a sensor device other than the photoelectric sensor and the like.

While the present invention has been described in embodiments, it should be understood that the embodiments disclosed herein are illustrative and non-restrictive in any respect. The scope of the present invention is defined by the terms of the claims, and is intended to include any modifications within the meaning and scope equivalent to the terms of the claims.

What is claimed is:

1. A sensor device comprising:
    a casing provided with an opening;
    a cover member covering the opening;
    a gasket interposed between the cover member and a portion of the casing located at a peripheral edge of the opening, to surround the opening; and
    a fixing cover pressing the cover member toward the casing and thus holding the cover member to bring the gasket into close contact with the casing and the cover member, a plurality of welded portions bonding the casing and the fixing cover together,
    wherein the welded portions are provided outside of the cover member such that each of the welded portions are distant enough from the gasket such that the welding of the welding portions does not melt the gasket when the welded portions are welded, wherein the plurality of welded portions are each provided at a position on a side of the casing inwardly of a bottom surface of the gasket in a direction along a normal to an opening plane of the opening.

2. The sensor device according to claim 1, wherein:
    the casing includes a first external surface provided with the opening, a second external surface extending continuously from the first external surface to configure a first projected corner with the first external surface, and a third external surface located on a side opposite to that on which the second external surface is located as seen from the first external surface, and extending continuously from the first external surface to configure a second projected corner with the first external surface;

the fixing cover includes a first plate-like portion which covers at least a portion of the first external surface, a second plate-like portion which covers at least a portion of the second external surface, and a third plate-like portion which covers at least a portion of the third external surface such that the fixing cover straddles the first external surface, the second external surface, and the third external surface;

at least one of the plurality of welded portions is provided to bond the second external surface and the second plate-like portion together; and at least another one of the plurality of welded portions is provided to bond the third external surface and the third plate-like portion together.

3. The sensor device according to claim 2, wherein the first external surface and the first plate-like portion are not bonded together.

4. The sensor device according to claim 3, wherein the second plate-like portion and the third plate-like portion are pressed against the second external surface and the third external surface, respectively, by a resilient force which the fixing cover has.

5. The sensor device according to claim 4, wherein the first projected corner and the second projected corner are each provided with a chamfered portion.

6. The sensor device according to claim 5, wherein:
the first external surface is provided with a loop groove in which the gasket is accommodated; and
the plurality of welded portions are each provided at a position on a side of the casing inwardly of a bottom surface of the loop groove in the direction along the normal to the opening plane of the opening.

7. The sensor device according to claim 4, wherein:
the first external surface is provided with a loop groove in which the gasket is accommodated; and
the plurality of welded portions are each provided at a position on a side of the casing inwardly of a bottom surface of the loop groove in the direction along the normal to the opening plane of the opening.

8. The sensor device according to claim 3, wherein the first projected corner and the second projected corner are each provided with a chamfered portion.

9. The sensor device according to claim 8, wherein:
the first external surface is provided with a loop groove in which the gasket is accommodated; and
the plurality of welded portions are each provided at a position on a side of the casing inwardly of a bottom surface of the loop groove in the direction along the normal to the opening plane of the opening.

10. The sensor device according to claim 3, wherein:
the first external surface is provided with a loop groove in which the gasket is accommodated; and
the plurality of welded portions are each provided at a position on a side of the casing inwardly of a bottom surface of the loop groove in the direction along the normal to the opening plane of the opening.

11. The sensor device according to claim 2, wherein the second plate-like portion and the third plate-like portion are pressed against the second external surface and the third external surface, respectively, by a resilient force which the fixing cover has.

12. The sensor device according to claim 11, wherein the first projected corner and the second projected corner are each provided with a chamfered portion.

13. The sensor device according to claim 12, wherein:
the first external surface is provided with a loop groove in which the gasket is accommodated; and
the plurality of welded portions are each provided at a position on a side of the casing inwardly of a bottom surface of the loop groove in the direction along the normal to the opening plane of the opening.

14. The sensor device according to claim 11, wherein:
the first external surface is provided with a loop groove in which the gasket is accommodated; and
the plurality of welded portions are each provided at a position on a side of the casing inwardly of a bottom surface of the loop groove in the direction along the normal to the opening plane of the opening.

15. The sensor device according to claim 2, wherein the first projected corner and the second projected corner are each provided with a chamfered portion.

16. The sensor device according to claim 15, wherein:
the first external surface is provided with a loop groove in which the gasket is accommodated; and
the plurality of welded portions are each provided at a position on a side of the casing inwardly of a bottom surface of the loop groove in the direction along the normal to the opening plane of the opening.

17. The sensor device according to claim 2, wherein:
one of the second external surface and the second plate-like portion is provided with a first engaging portion;
the other of the second external surface and the second plate-like portion is provided with a first engaged portion;
one of the third external surface and the third plate-like portion is provided with a second engaging portion;
the other of the third external surface and the third plate-like portion is provided with a second engaged portion; and
the first engaging portion and the first engaged portion are engaged together and the second engaging portion and the second engaged portion are engaged together.

18. The sensor device according to claim 2, wherein a portion of the first plate-like portion immediately adjacent to the second plate-like portion and a portion of the first plate-like portion immediately adjacent to the third plate-like portion are both formed to be bent to be away from the first external surface.

19. A sensor device comprising:
a casing provided with an opening;
a cover member covering the opening;
a gasket interposed between the cover member and a portion of the casing located at a peripheral edge of the opening, to surround the opening; and
a fixing cover pressing the cover member toward the casing and thus holding the cover member to bring the gasket into close contact with the casing and the cover member, a plurality of welded portions bonding the casing and the fixing cover together being provided in a region outside the cover member such that the welded portions are distant from each other, wherein
the casing includes a first external surface provided with the opening, a second external surface extending continuously from the first external surface to configure a first projected corner with the first external surface, and a third external surface located on a side opposite to that on which the second external surface is located as seen from the first external surface, and extending continuously from the first external surface to configure a second projected corner with the first external surface;

the fixing cover includes a first plate-like portion which covers at least a portion of the first external surface, a second plate-like portion which covers at least a portion of the second external surface, and a third plate-like portion which covers at least a portion of the third external surface such that the fixing cover straddles the first external surface, the second external surface, and the third external surface;

at least one of the plurality of welded portions is provided to bond the second external surface and the second plate-like portion together and at least another one of the plurality of welded portions is provided to bond the third external surface and the third plate-like portion together;

the first external surface is provided with a loop groove in which the gasket is accommodated; and the plurality of welded portions are each provided at a position on a side of the casing inwardly of a bottom surface of the loop groove in a direction along a normal to an opening plane of the opening.

20. A sensor device comprising:

a casing provided with an opening;

a cover member covering the opening;

a gasket interposed between the cover member and a portion of the casing located at a peripheral edge of the opening, to surround the opening; and a fixing cover pressing the cover member toward the casing and thus holding the cover member to bring the gasket into close contact with the casing and the cover member, a plurality of welded portions bonding the casing and the fixing cover together being provided in a region outside the cover member such that the welded portions are distant from each other, wherein the opening has a generally rectangular shape as seen in a direction along a normal to an opening plane of the opening;

the gasket has a generally rectangular shape having a corner in a form of a curve as seen in the direction along the normal to the opening plane of the opening; and the plurality of welded portions are each provided at a position corresponding to the corner in the form of the curve.

* * * * *